United States Patent [19]

Kawashima

[11] Patent Number: 5,740,102
[45] Date of Patent: Apr. 14, 1998

[54] DATA RETENTION CIRCUIT AND SEMICONDUCTOR MEMORY DEVICE USING THE SAME

[75] Inventor: Shoichiro Kawashima, Kawasaki, Japan

[73] Assignee: Fujitsu Limited, Kanagawa, Japan

[21] Appl. No.: 754,124

[22] Filed: Nov. 22, 1996

Related U.S. Application Data

[62] Division of Ser. No. 377,216, Jan. 24, 1995, Pat. No. 5,600,588.

[30] Foreign Application Priority Data

Jan. 24, 1994 [JP] Japan .................................. 6-006025

[51] Int. Cl.$^6$ .................................................. G11C 11/00
[52] U.S. Cl. .................. 365/154; 365/189.05; 365/156; 327/199
[58] Field of Search ............................ 365/154, 156, 365/189.05; 327/199, 534

[56] References Cited

U.S. PATENT DOCUMENTS

| | | |
|---|---|---|
| 4,858,195 | 8/1989 | Soneda . |
| 4,982,365 | 1/1991 | Ohtani et al. . |
| 5,020,029 | 5/1991 | Ichinose et al. . |
| 5,047,979 | 9/1991 | Leung . |
| 5,243,228 | 9/1993 | Maruyama et al. ................ 327/534 |
| 5,384,731 | 1/1995 | Kuriyama et al. ................ 365/154 |
| 5,557,231 | 9/1996 | Yamaguchi et al. ............... 327/534 |

Primary Examiner—David C. Nelms
Assistant Examiner—Huan Hoang
Attorney, Agent, or Firm—Nikaido, Marmelstein, Murray & Oram LLP

[57] ABSTRACT

A semiconductor memory device includes a memory unit having a plurality of memory cells. Each memory cell includes a flip-flop circuit having driver transistors, as a data retention circuit. The device further includes a threshold voltage control unit for controlling respective threshold voltages of the driver transistors. When the device is in its accessed state, the threshold voltage control unit controls at least each threshold voltage of driver transistors constituting a selected memory cell to be a first threshold voltage. When the device is in its stand-by state, the threshold voltage control unit controls threshold voltages of all of respective driver transistors constituting each memory cell to be a second threshold voltage different from the first threshold voltage. By the constitution, it is possible to realize a stable data retention operation under the condition of a lower power supply voltage, and to reduce a dissipated power in a stand-by state.

4 Claims, 17 Drawing Sheets

DATA RETENTION CIRCUIT AND SEMICONDUCTOR MEMORY DEVICE USING THE SAME

This is a division of application Ser. No. 08/377,216 filed Jan. 24, 1995 now U.S. Pat. No. 5,600,588.

BACKGROUND OF THE INVENTION

1. Field of the Invention

The present invention relates to a data retention circuit such as a flip-flop circuit, a latch circuit, or the like. More particularly, it relates to a semiconductor memory device provided with static memory cells each using a flip-flop circuit, i.e., a static random access memory (SRAM) device.

2. Description of the Related Art

Conventionally, there is known an SRAM device provided with a memory cell, for example, as shown in FIG. 1.

In FIG. 1, reference 1 denotes a flip-flop circuit; reference 2 a power supply line for supplying a power supply voltage VCC; references 3 and 4 each a resistor functioning as a load element; references 5 and 6 each an nMOS transistor functioning as a driver element; references 7 and 8 each an nMOS transistor functioning as a transfer gate; reference WL a word line; and references BL and BLX each a complementary bit line.

In the illustrated memory cell, a data retention stability in its accessed state (i.e., in its selected state) is determined by the ratio of a current-driving capacity of each driver transistor 5, 6 to a current-driving capacity of each transfer transistor 7, 8. Namely, when the above ratio is greater than 1, it is possible to realize a stable data retention operation (latch operation).

Assuming that a voltage applied to back gates of each driver transistor 5, 6 (hereinafter referred to as a back-bias voltage) is 0 V, a drain current (ID) of each driver transistor 5, 6 is expressed as follows:

$$ID = \tfrac{1}{2} \times \beta (VG - VTH)^2$$

Note, VG indicates a gate voltage of each driver transistor, and VTH indicates a threshold voltage thereof.

Accordingly, to increase the current-driving capacity of each driver transistor 5, 6 to thereby realize a stable data retention operation, the threshold voltage VTH of each driver transistor needs to be lowered. For example, so long as the threshold voltage VTH of each driver transistor 5, 6 is not lowered to below 0.9 V when the power supply voltage VCC is 2.5 V, the drain current ID of each driver transistor 5, 6 does not become fully large, and thus it is impossible to realize a stable data retention operation. Also, where the power supply voltage VCC is 2.0 V, the threshold voltage VTH of each driver transistor 5, 6 needs to be lowered to below 0.4 V. Otherwise, the drain current ID of each driver transistor 5, 6 would not become fully large, and thus it would be impossible to realize a stable data retention operation.

Thus, in the memory cell shown in FIG. 1, so long as the threshold voltage VTH of each driver transistor 5, 6 is not lowered, it is impossible to carry out a stable data retention operation under the condition of a lower power supply voltage.

However, where the threshold voltage VTH of each driver transistor 5, 6 is excessively lowered, a problem occurs in that a leak current due to a sub-threshold current remarkably flows in each of non-selected memory cells. Assuming that the gate voltage VG is constant, the sub-threshold current is decreased at the rate of approximately one tenth for an increase of 0.1 V of the threshold voltage VTH. For example, where the gate voltage VG is 0 V, the sub-threshold current in the case of the threshold voltage VTH being 0.4 V becomes large $10^5$ times that in the case of the threshold voltage VTH being 0.9 V.

Accordingly, in the VG-ID characteristics in the case of the source voltage being 0 V, it is possible to define the gate voltage VG in the case of the drain current ID being 12 nA, as the threshold voltage VTH.

In this case, when the threshold voltage VTH is 0.4 V and the gate voltage VG is 0 V, the subthreshold current amounts to 1.2 pA. For example, where the memory device has the capacity of 1M bits, the sum of sub-threshold currents amounts to 1.2 μA. Accordingly, when each memory cell is in its stand-by state, a problem occurs in that a power dissipated in the memory device becomes relatively large.

Also, where the power supply voltage VCC is lowered to 1.5 V, the threshold voltage VTH of each driver transistor 5, 6 needs to be accordingly lowered to 0.1 V to 0 V . Otherwise, it would be impossible to realize a stable data retention operation in a selected state of each memory cell.

However, when the power supply voltage VCC is lowered to 1.5 V, a leak current in each of non-selected memory cells amounts to approximately 20 nA, and thus exceeds 1 nA which is the maximum current value that each load resistor 3, 4 can supply. As a result, a problem occurs in that it is impossible to carry out a data retention operation in a stand-by state (i.e., in a non-selected state) of each memory cell.

Although the above related art is explained by way of an SRAM device as an example, it is not restrictive. Namely, the above explanation and the relevant problem generally apply to a data retention circuit such as a flip-flop circuit, a latch circuit, or the like.

SUMMARY OF THE INVENTION

An object of the present invention is to provide a data retention circuit by which it is possible to realize a stable data retention operation under the condition of a lower power supply voltage, and to reduce a dissipated power in a stand-by state.

Another object of the present invention is to provide a semiconductor memory device using a data retention circuit such as a flip-flop circuit.

According to a first aspect of the present invention, there is provided a semiconductor memory device including: a memory means having a plurality of memory cells, each memory cell including a flip-flop circuit having driver transistors; and a threshold voltage control means for controlling respective threshold voltages of the driver transistors, the threshold voltage control means controlling at least each threshold voltage of driver transistors constituting a selected memory cell to be a first threshold voltage when the memory device is in its accessed state, and the threshold voltage control means controlling threshold voltages of all of respective driver transistors constituting each memory cell to be a second threshold voltage different from the first threshold voltage when the memory device is in its stand-by state.

Also, according to a second aspect of the present invention, there is provided a data retention circuit including: a data latch part including at least one flip-flop circuit having transistors of CMOS structure; a gating means responsive to a control signal, for controlling an inputting of data into the data latch part and an outputting of data from the data latch part; and means for controlling a back-bias voltage of at least one of the transistors constituting the flip-flop circuit to be a first voltage in an active state of the data retention circuit, and for controlling the back-bias voltage to be a second voltage different from the first voltage in a stand-by state of the data retention circuit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
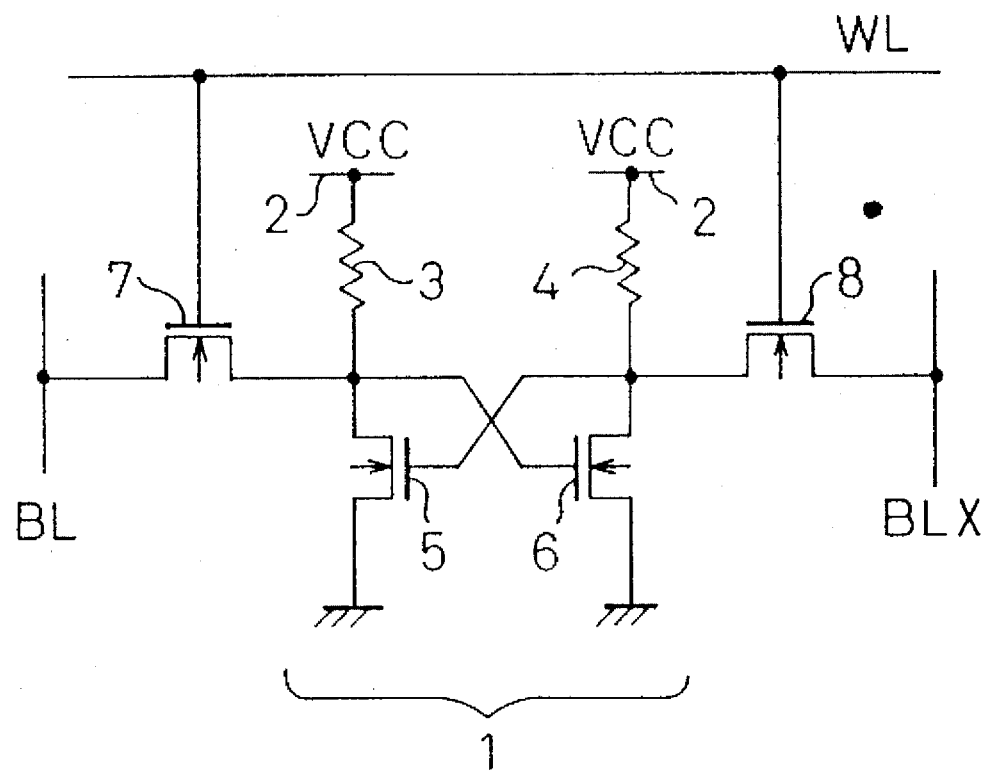
FIG. 1 is a circuit diagram showing a constitution of a typical memory cell provided in a conventional SRAM device.
Figure 2:
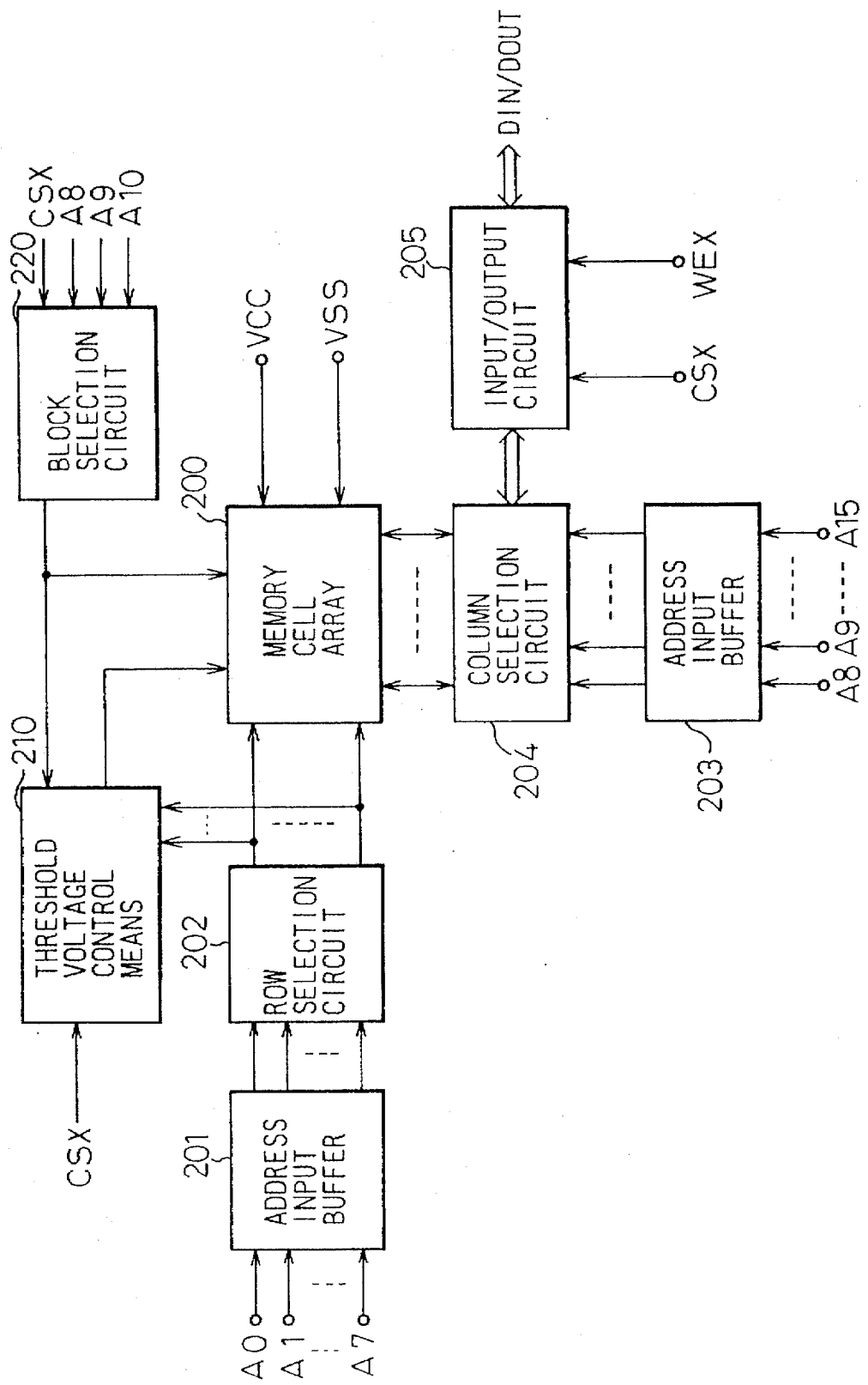
FIG. 2 is a block diagram schematically showing the entire constitution of the SRAM device using flip-flop circuits according to the first aspect of the present invention.

FIG. 2 schematically illustrates the entire constitution of the SRAM device using flip-flop circuits according to the first aspect of the present invention.

In the illustration, reference 200 denotes a memory cell array in which a static memory cell is provided at each intersection of a plurality of word lines and a plurality of pairs of bit lines; reference 201 an address input buffer for effecting a buffering of a row address signal of eight bits received at address input terminals A0 to A7; reference 202 a row selection circuit for decoding the row address signal of eight bits to thereby select one of the plurality of word lines; reference 203 an address input buffer for effecting a buffering of a column address signal of eight bits received at address input terminals A8 to A15; reference 204 a column selection circuit for decoding the column address signal of eight bits to thereby select one of the plurality of pairs of bit lines; and reference 205 an input/output circuit responsive to an active-low chip select signal CSX and an active-low write enable signal WEX, for controlling the inputting of an input data DIN from the outside of the device and the outputting of an output data DOUT from the column selection circuit 204.

Also, reference 210 denotes a threshold voltage control means for controlling respective threshold voltages of driver transistors constituting each memory cell provided in the memory cell array 200. Reference 220 denotes a block selection circuit which responds to the chip select signal CSX and an address signal of three bits (AS to A10) and thereby selects one from among blocks divided into eight in the memory cell array 200.

The threshold voltage control means 210 controls respective threshold voltages of driver transistors based on the chip select signal CSX, based on outputs of the row selection circuit 202, or based on an output of the block selection circuit 220. Also, the block selection circuit 220 is used only in the fourth embodiment of the present invention.

Hereinafter, the first to fourth embodiments of the SRAM device according to the first aspect of the present invention will be explained with reference to FIGS. 3 to 15.

Figure 3:
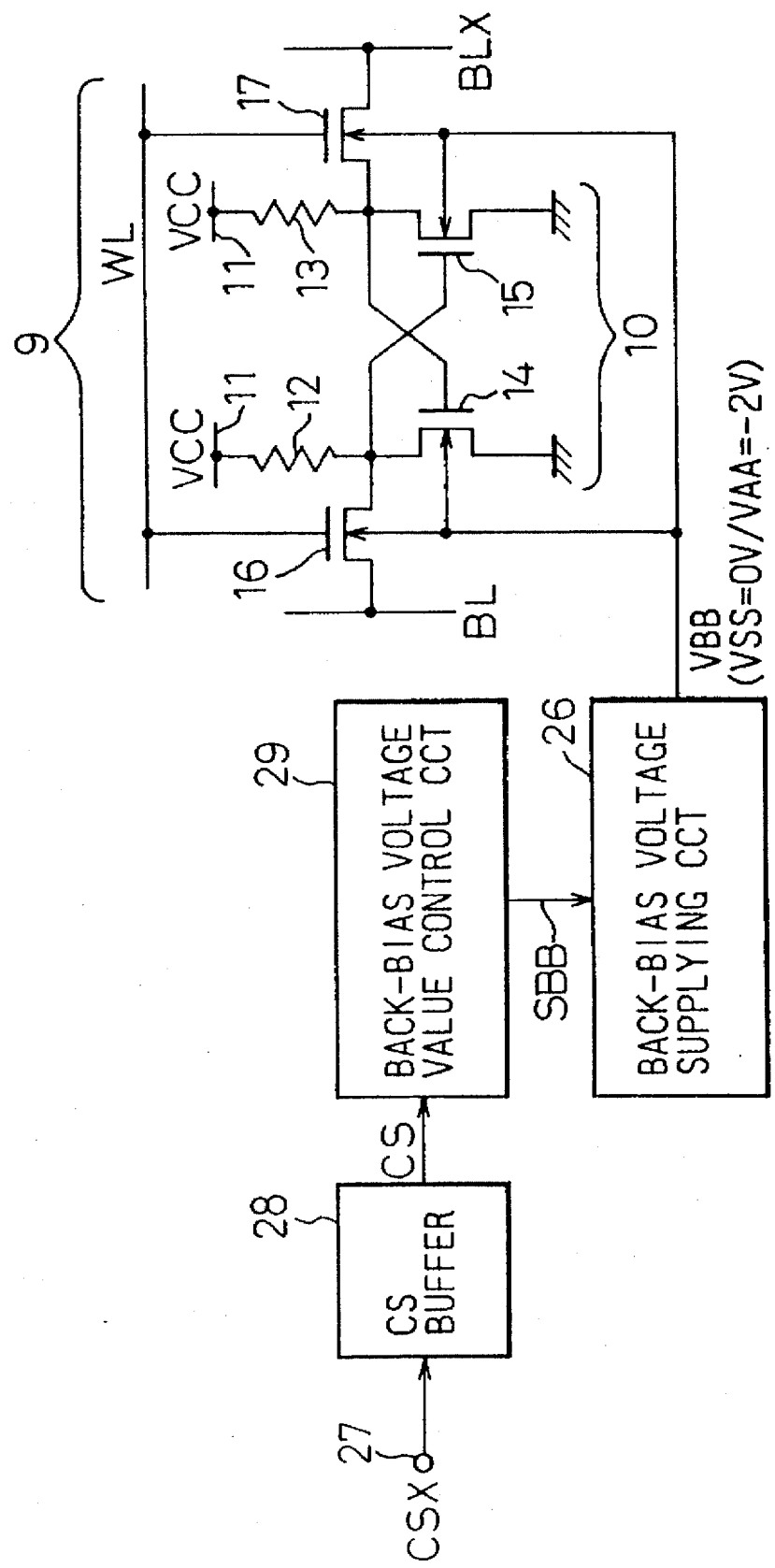
FIG. 3 is a diagram showing a constitution of the main part in a first embodiment of the SRAM device according to the first aspect of the present invention.

FIG. 3 illustrates a constitution of the main part in the first embodiment of the present invention.

In the illustration, reference 9 denotes a static memory cell; reference 10 a flip-flop circuit; reference 11 a power supply line for supplying a power supply voltage VCC; references 12 and 13 each a resistor functioning as a load element; references 14 and 15 each an nMOS transistor functioning as a driver element; references 16 and 17 each an nMOS transistor functioning as a transfer gate; reference WL a word line; and references BL and BLX each a complementary bit line.

Figure 4:
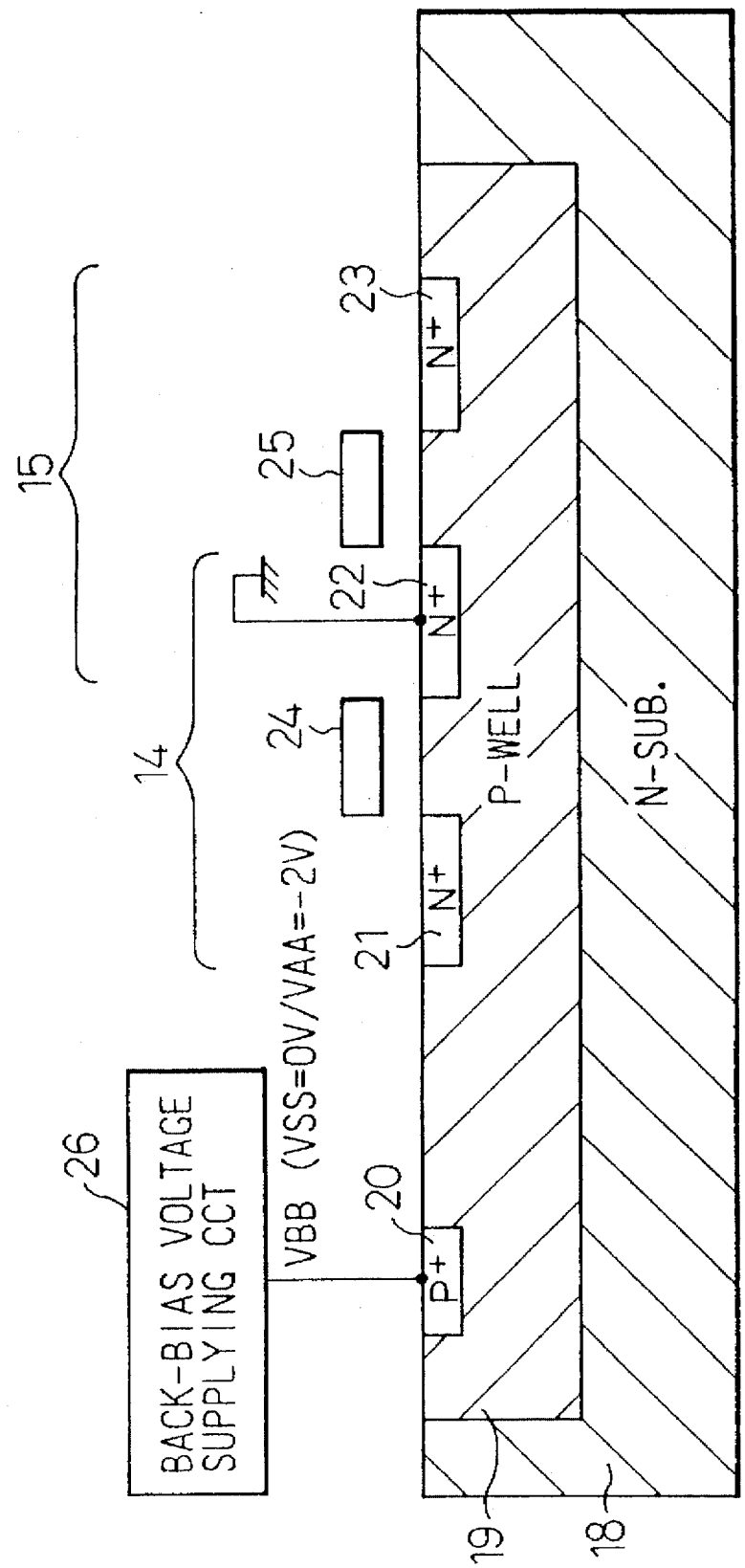
FIG. 4 is a sectional view schematically showing a structure of the driver transistor portion constituting the memory cell shown in FIG. 3.

The driver transistors 14 and 15 are formed on a substrate as shown in FIG. 4, which schematically shows a sectional structure of the driver transistor portion.

In FIG. 4, reference 18 denotes an N-type silicon substrate; reference 19 a P-type well; reference 20 a p-type diffused region; references 21 to 23 each an N-type diffused region; and references 24 and 25 each a polysilicon layer. The driver transistor 14 is constituted by the N-type diffused region 21 functioning as a drain, the N-type diffused region 22 functioning as a source, and the polysilicon layer 24 functioning as a gate electrode. On the other hand, the driver transistor 15 is constituted by the N-type diffused region 22 functioning as a source, the N-type diffused region 23 functioning as a drain, and the polysilicon layer 25 functioning as a gate electrode.

Referring back to FIG. 3, reference 26 denotes a back-bias voltage supplying circuit, which supplies the P-type well 19 with a back-bias voltage VBB for the driver transistors 14 and 15 and the transfer gate transistors 16 and 17. The circuit constitution of the back-bias voltage supplying circuit 26 will be explained later.

Also, reference 27 denotes an input terminal for receiving an active-low chip select signal CSX from the outside of the device, and reference 28 denotes a CS buffer responsive to the chip select signal CSX, for outputting an inverted internal chip select signal CS.

Also, reference 29 denotes a back-bias voltage value control circuit, which is responsive to to the internal chip select signal CS and generates a back-bias voltage value control signal SBB. Using the control signal SBB, the back-bias voltage value control circuit 29 controls a voltage value of the back-bias voltage VBB which the back-bias voltage supplying circuit 26 outputs. The circuit constitution of the back-bias voltage value control circuit 29 will be explained later.

Figure 5:
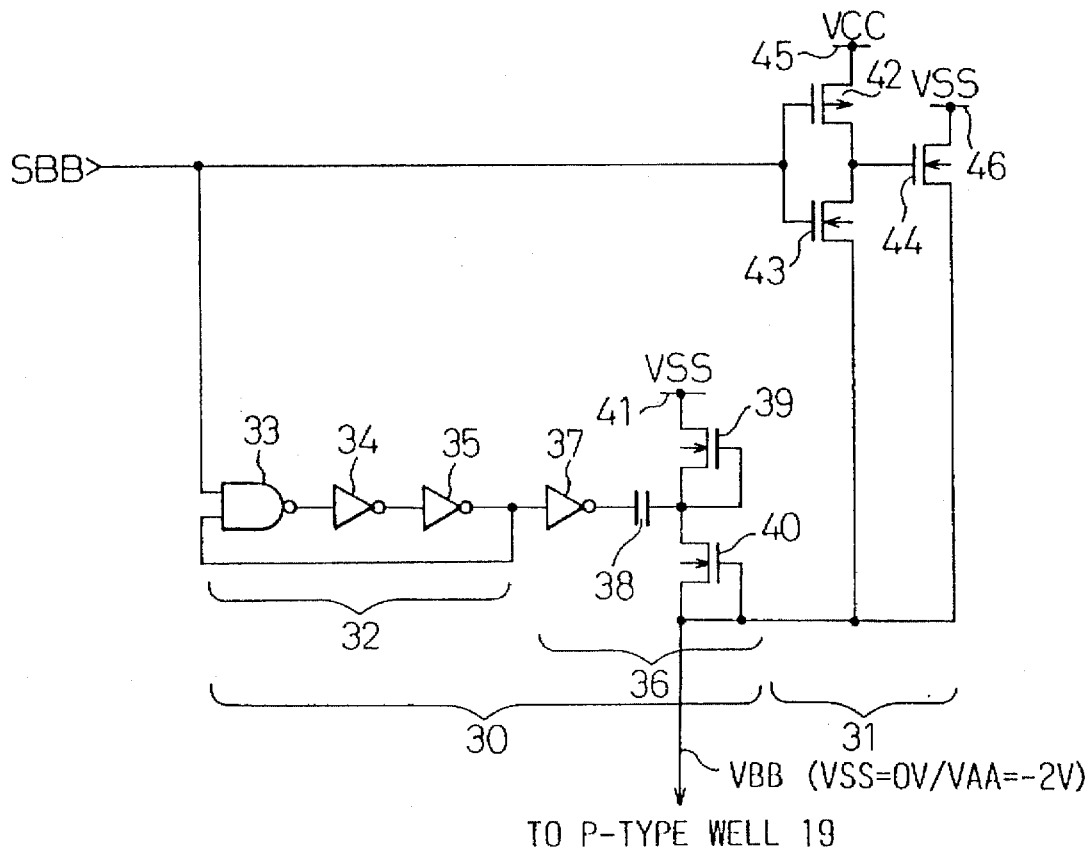
FIG. 5 is a circuit diagram showing a constitution of the back-bias voltage supplying circuit shown in FIG. 3.

The back-bias voltage supplying circuit 26 is constituted as shown in FIG. 5.

In FIG. 5, reference 30 denotes a negative voltage generating circuit for generating a negative voltage VAA, e.g., −2 V, as the back-bias voltage VBB, and reference 31 denotes a ground voltage outputting circuit for outputting a ground voltage VSS as the back-bias voltage VBB.

In the negative voltage generating circuit 30, reference 32 denotes a ring oscillator; reference 33 a NAND circuit; references 34 and 35 each an inverter; reference 36 a charge-pumping circuit; reference 37 an inverter functioning as a buffer; reference 38 a capacitor; references 39 and 40 each an nMOS transistor; and reference 41 a power supply line for supplying the ground voltage VSS.

Also, in the ground voltage outputting circuit 31, reference 42 denotes a pMOS transistor; references 43 and 44 each an nMOS transistor; reference 45 a VCC power supply line; and reference 46 a VSS power supply line.

When the back-bias voltage value control signal SBB output from the back-bias voltage value control circuit 29 is at "L" level, an output of the NAND circuit 33 in the negative voltage generating circuit 30 is fixed at "H" level. Accordingly, the ring oscillator 32 is inactivated and thus the charge-pumping circuit 36 does not generate the negative voltage VAA.

On the other hand, in the ground voltage outputting circuit 31, the pMOS transistor 42 is turned ON and the nMOS transistor 43 is turned OFF. Accordingly, the gate voltage of the nMOS transistor 44 is brought to a level of VCC and thus the nMOS transistor 44 is turned ON.

Therefore, in this case, the ground voltage VSS (=0 V) as the back-bias voltage VBB is fed from the VSS power supply line 46 via the nMOS transistor 44 to the P-type well 19.

Contrary to this, when the back-bias voltage value control signal SBB is at "H" level, the NAND circuit 33 functions as an inverter for an output of the inverter 35. Accordingly, the ring oscillator 32 carries out its oscillation and thus the charge-pumping circuit 36 generates the negative voltage VAA.

On the other hand, in the ground voltage outputting circuit 31, the pMOS transistor 42 is turned OFF and the nMOS transistor 43 is turned ON. Accordingly, the gate voltage of the nMOS transistor 44 is brought to a level of VAA and thus the nMOS transistor 44 is turned OFF.

Therefore, in this case, the negative voltage VAA (=−2 V) as the back-bias voltage VBB is fed from the negative voltage generating circuit 30 to the P-type well 19.

Figure 6:
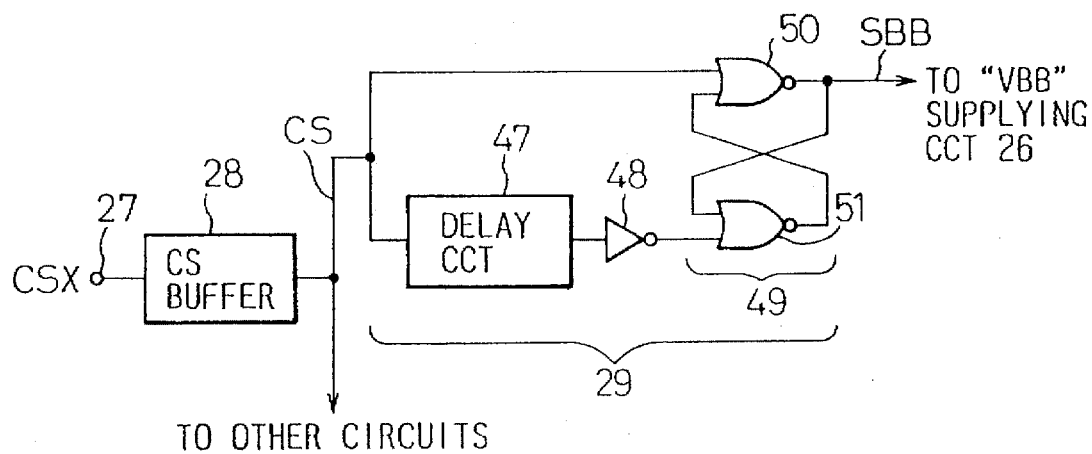
FIG. 6 is a circuit diagram showing a constitution of the back-bias voltage value control circuit shown in FIG. 3.

Also, the back-bias voltage value control circuit 29 is constituted as shown in FIG. 6.

In FIG. 6, reference 47 denotes a delay circuit; reference 48 an inverter; reference 49 a flip-flop circuit; and references 50 and 51 each a NOR circuit constituting the flip-flop circuit 49.

Figure 7:
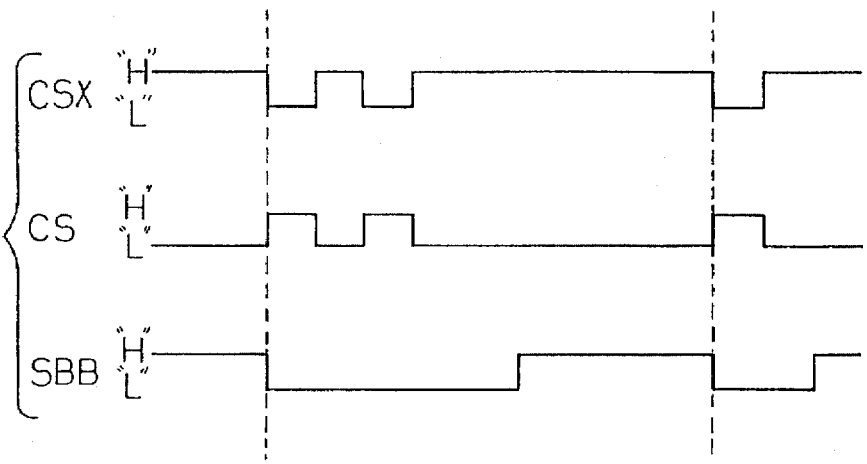
FIG. 7 is an operational timing chart of the circuit shown in FIG. 6.

FIG. 7 shows timing waveforms representing the operation of the back-bias voltage value control circuit 9.

As shown in FIG. 7, where access to the memory device is successively carried out, the back-bias voltage value control circuit 29 outputs the back-bias voltage value control signal SBB of "L" level. Contrary to this, where access to the memory device is not carried out for a predetermined period, i.e., where each memory cell is brought to its stand-by state, the back-bias voltage value control circuit 29 outputs the back-bias voltage value control signal SBB of "H" level.

Thus, in the present embodiment, when the external chip select signal CSX is made "L" level to bring the memory device to an accessed state, the back-bias voltage value control circuit 29 outputs the back-bias voltage value control signal SBB of "L" level. Upon receipt of the control signal SBB of "L" level, the back-bias voltage supplying circuit 26 outputs the ground voltage VSS (=0 V) as the back-bias voltage VBB and feeds it to the P-type well 19.

Contrary to this, where the external chip select signal CSX is made "H" level and thereafter access to the memory device is not carried out for a predetermined period, i.e., where each memory cell is brought to its stand-by state, the back-bias voltage value control circuit 29 outputs the back-bias voltage value control signal SBB of "H" level. Upon receipt of the control signal SBB of "H" level, the back-bias voltage supplying circuit 26 outputs the negative voltage VAA (=−2 V) as the back-bias voltage VBB and feeds it to the P-type well 19.

For example, by selecting the threshold voltage VTH of each driver transistor 14, 15 to be approximately 0.4 V in the case of the back-bias voltage VBB being 0 V, it is possible to heighten the threshold voltage VTH of each driver transistor 14, 15 up to approximately 0.9 V when the back-bias voltage VBB is −2 V.

Thus, in the present embodiment, when the memory device is in its accessed state, it is possible to relatively decrease the threshold voltage VTH of each driver transistor constituting a selected memory cell, e.g., to approximately 0.4 V. As a result, it is possible to realize a stable data retention operation with respect to the selected memory cell.

Also, when the memory device is in its accessed state, in each of non-selected memory cells, it is possible to suppress a leak current in the case of the gate voltage VG of each driver transistor being 0 V, e.g., to approximately 1.2 pA. Namely, it is possible to fully decrease the leak current, compared with 1 nA which is the maximum current value that each load resistor 12, 13 can supply. As a result, it is possible to realize a stable data retention operation with respect to the non-selected memory cells.

On the other hand, when the memory device is in its stand-by state, it is possible to relatively increase the threshold voltage VTH of each driver transistor constituting the respective memory cells, e.g., to approximately 0.9 V. As a result, it is possible to suppress a leak current in the case of the gate voltage VG being 0 V, to approximately $1.2 \times 10^{-5}$ pA. For example, where the memory device has the capacity of 1M bits, it is possible to suppress the sum of leak currents to approximately 12 pA.

Therefore, where the back-bias voltage supplying circuit 26 is designed to have a dissipated current of 0.5 μA, it is possible to reduce the stand-by current to approximately half the stand-by current (1.2 μA) in a conventional SRAM device.

As explained above, according to the first embodiment of the present invention, it is possible to realize a stable data retention operation under the condition of a lower power supply voltage, and to reduce a dissipated power in a stand-by state.

Figure 8:
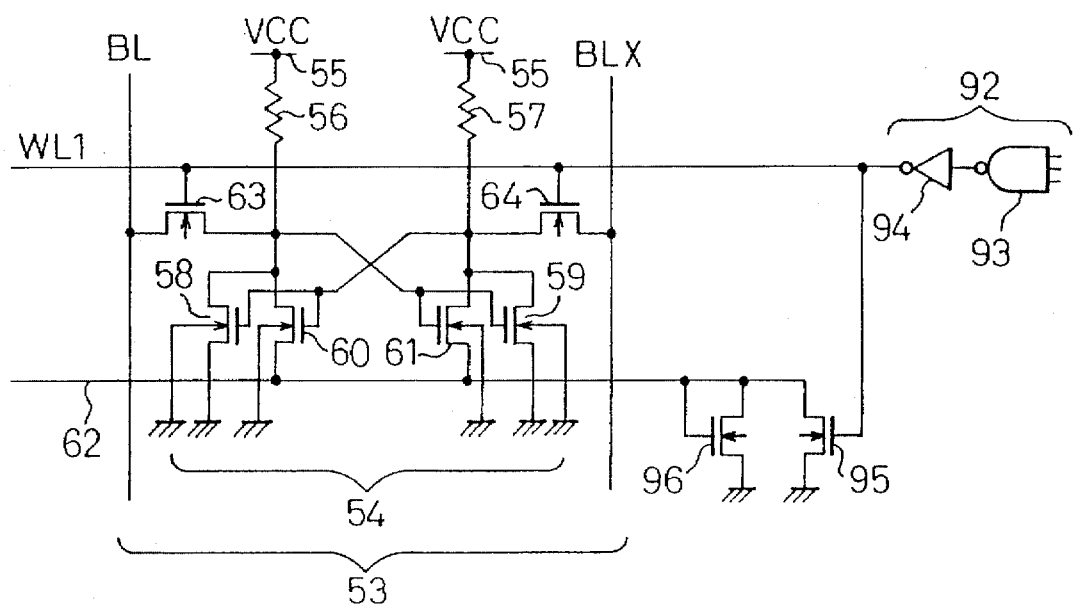
FIG. 8 is a circuit diagram showing a constitution of the main part in a second embodiment of the SRAM device according to the first aspect of the present invention.

FIG. 8 illustrates a constitution of the main part in the second embodiment of the present invention.

In the illustration, reference 53 denotes a static memory cell; reference 54 a flip-flop circuit; reference 55 a VCC power supply line; references 55 and 57 each a resistor functioning as a load element; references 58 to 61 each an nMOS transistor functioning as a driver element and having the same channel width; reference 62 a threshold voltage control line for controlling respective threshold voltages of the driver transistors 58 to 61; references 63 and 64 each an nMOS transistor functioning as a transfer gate; reference WL1 a word line; and references BL and BLX each a complementary bit line.

Respective sources of the driver transistors 58 and 59 are grounded, and respective sources of the driver transistors 60 and 61 are connected to the threshold voltage control line 62. Also, drains of the driver transistors 58 and 59 are connected to drains of the driver transistors 60 and 61, respectively.

Figure 9:
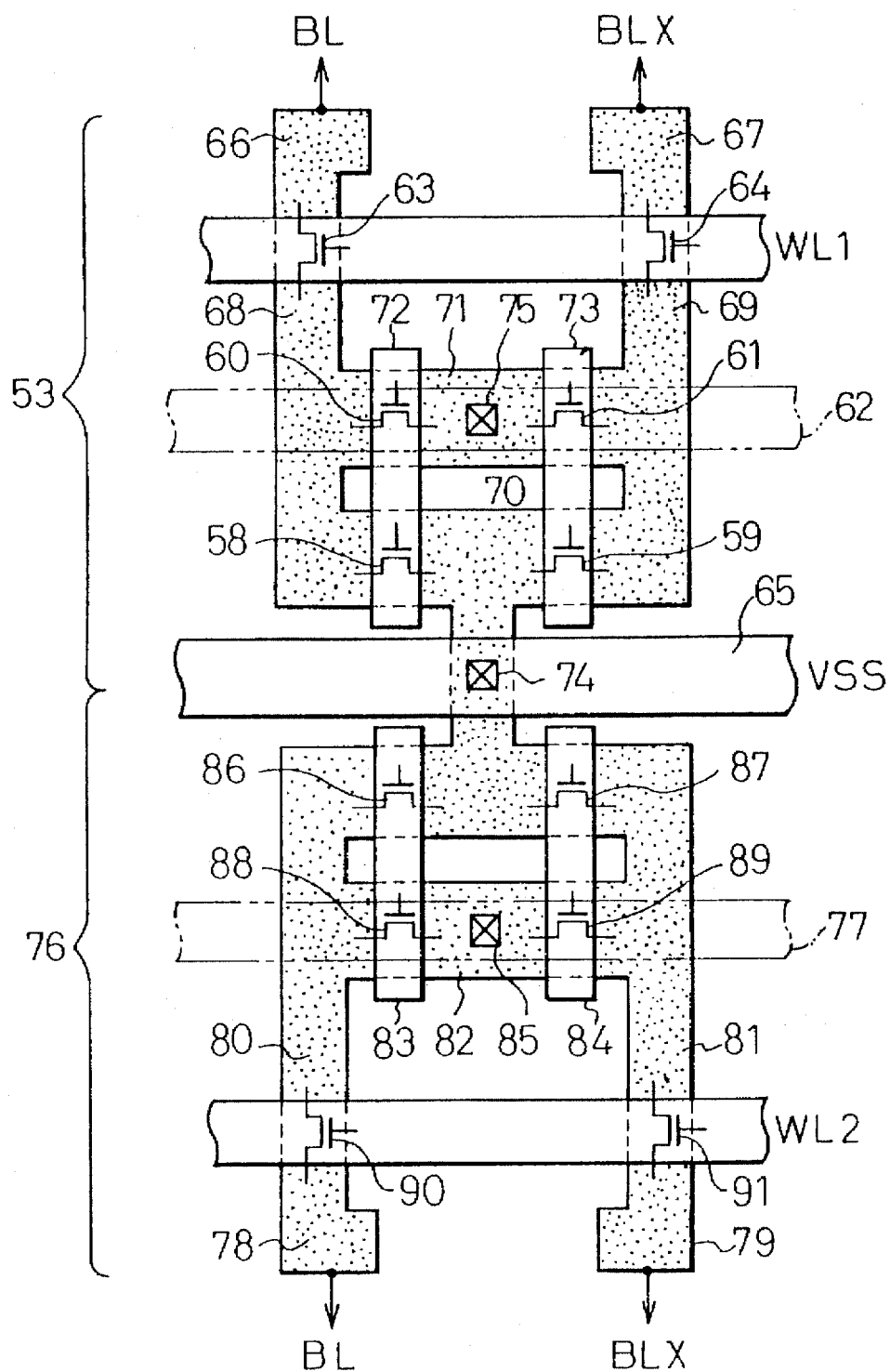
FIG. 9 is a plan view schematically showing a layout pattern of the memory cell shown in FIG. 8 and the adjacent memory cell.

The memory cell 53 is formed as shown in FIG. 9, which schematically shows a layout pattern of the memory cell 53 and the adjacent memory cell.

In FIG. 9, reference 65 denotes a VSS (ground level) power supply line; references 66 to 71 each an N-type diffused region; references 72 and 73 each a polysilicon layer; reference 74 a contact hole for connecting the N-type diffused region 70 to the VSS power supply line 65; and reference 75 a contact hole for connecting the N-type diffused region 71 to the threshold voltage control line 62.

The driver nMOS transistor 58 is constituted by the N-type diffused region 68 functioning as a drain, the N-type diffused region 70 functioning as a source, and the polysilicon layer 72 functioning as a gate electrode. Also, the driver nMOS transistor 59 is constituted by the N-type diffused region 69 functioning as a drain, the N-type diffused region 70 functioning as a source, and the polysilicon layer 73 functioning as a gate electrode. On the other hand, the driver nMOS transistor 60 is constituted by the N-type diffused region 68 functioning as a drain, the N-type diffused region 71 functioning as a source, and the polysilicon layer 72 functioning as a gate electrode. Also, the driver nMOS transistor 61 is constituted by the N-type diffused region 69 functioning as a drain, the N-type diffused region 71 functioning as a source, and the polysilicon layer 73 functioning as a gate electrode.

Also, reference 76 denotes a memory cell having the same constitution as that of the memory cell 53. In the memory cell 76, reference WL2 denotes a word line; reference 77 a threshold voltage control line; references 78 to 82 each an N-type diffused region; references 83 and 84 each a polysilicon layer; and reference 85 a contact hole for connecting the N-type diffused region 82 to the threshold voltage control line 77. Also, references 86 to 89 denote driver transistors corresponding to the driver transistors 58 to 61, respectively, and references 90 and 91 denote transfer transistors corresponding to the transfer transistors 63 and 64, respectively.

Referring back to FIG. 8, reference 92 denotes a row decoder which includes a NAND gate 93 and an inverter 94; reference 95 denotes an nMOS transistor responsive to an output of the row decoder 92, for controlling a potential on the threshold voltage control line 62; and reference 96 denotes an nMOS transistor connected between the control line 62 and the ground line and responsive to a potential on the control line 62.

In the present embodiment, when the memory cell 53 is selected, the output of the row decoder 92 (i.e., potential on the word line WL1) is brought to "H" level. Accordingly, the nMOS transistor 95 is turned ON and thus the potential on the threshold voltage control line 62 is pulled down to the ground level ("L" level).

Namely, in this case, the sources of the driver transistors 58 to 61 are all brought to "L" level. As a result, the driver transistors 58 and 60, and the driver transistors 59 and 61, carry out a parallel operation, respectively.

It is now assumed that, with respect to the driver transistors 58 to 61, respective threshold voltages are designed to be 0.5 V. Where the driver transistors 58 and 60, and the driver transistors 59 and 61, carry out a parallel operation, respectively, this is equivalent to that the driver transistors 60 and 61 are not used and each channel width of the driver transistors 58 and 59 is made twice.

Accordingly, in this case, each driver transistor 58, 59 is operated as a transistor having the threshold voltage of 0.4 V, respectively.

Contrary to this, when the memory cell 53 is not selected, the output of the row decoder 92 (i.e., potential on the word line WL1) is brought to "L" level. Accordingly, the nMOS transistor 95 is turned OFF and thus the potential on the threshold voltage control line 62 is brought to a level of the threshold voltage (e.g., 0.4 V) of the nMOS transistor 96.

Namely, in this case, only the driver transistors 58 and 59 can be operated. Accordingly, each driver transistor 58, 59 is operated as a transistor having the threshold voltage of 0.5 V, respectively.

Thus, in the present embodiment, it is possible to relatively decrease the threshold voltage of each driver transistor in a selected memory cell, e.g., to approximately 0.4 V. As a result, it is possible to realize a stable data retention operation.

Also, in a stand-by state (i.e., in a non-selected state), it is possible to relatively increase the threshold voltage of each driver transistor in the corresponding memory cell, e.g., to approximately 0.5 V. As a result, it is possible to suppress a leak current in the case of the gate voltage VG being 0 V, to approximately 0.12 pA. For example, where the memory device has the capacity of 1M bits, it is possible to suppress the sum of leak currents to approximately 120 nA.

As explained above, according to the second embodiment of the present invention, it is possible to realize a stable data retention operation under the condition of a lower power supply voltage, and to reduce a dissipated power in a stand-by state.

Figure 10:
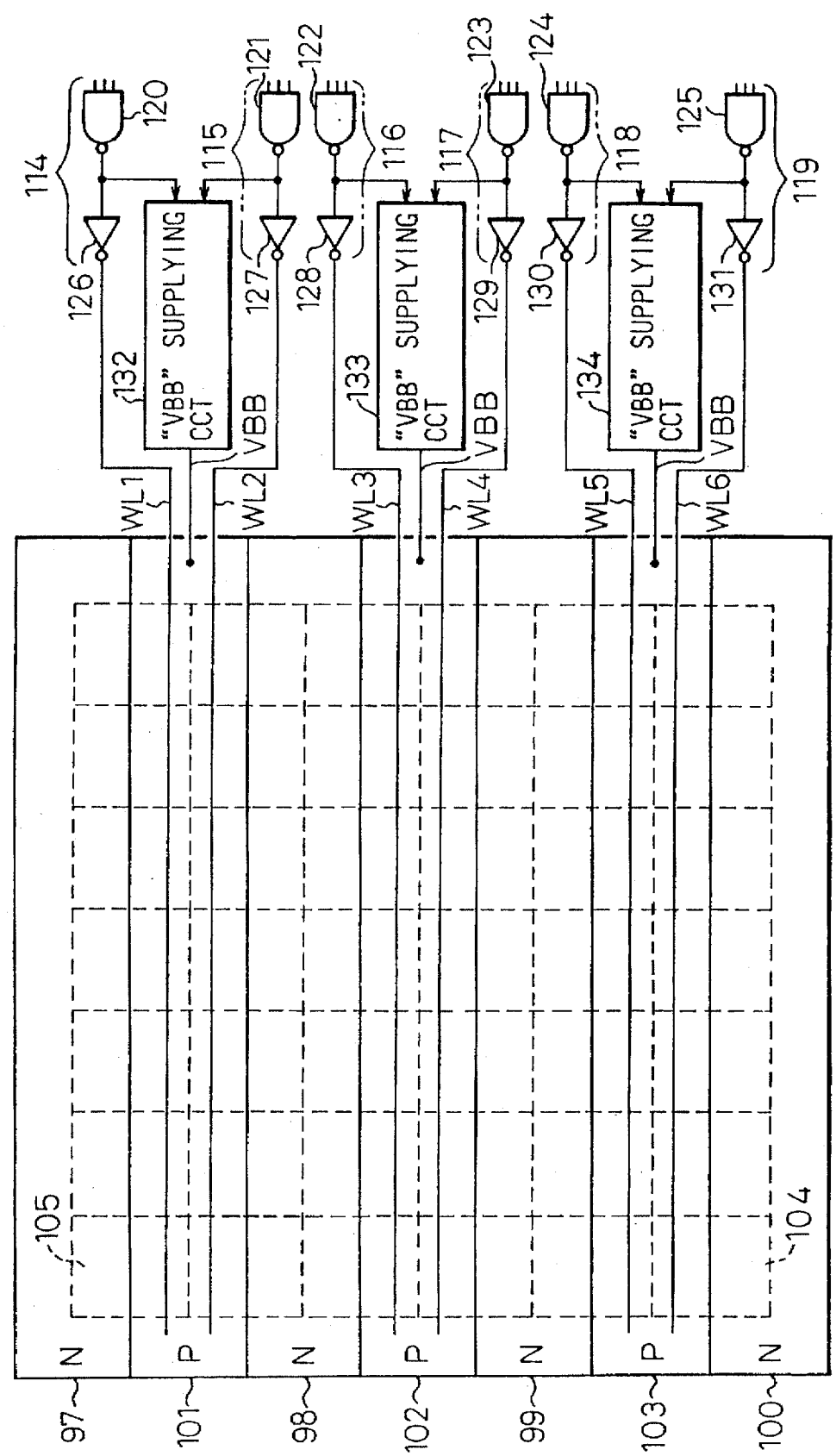
FIG. 10 is a diagram showing a constitution of the main part in a third embodiment of the SRAM device according to the first aspect of the present invention.

FIG. 10 illustrates a constitution of the main part in the third embodiment of the present invention.

In the illustration, references 97 to 100 each denote an N-type well; references 101 to 103 each a P-type well; and references WL1 to WL6 each a word line. Also, a predetermined number of CMOS-type memory cells are formed in each region 105 sectioned by a broken line 104.

Figure 11:
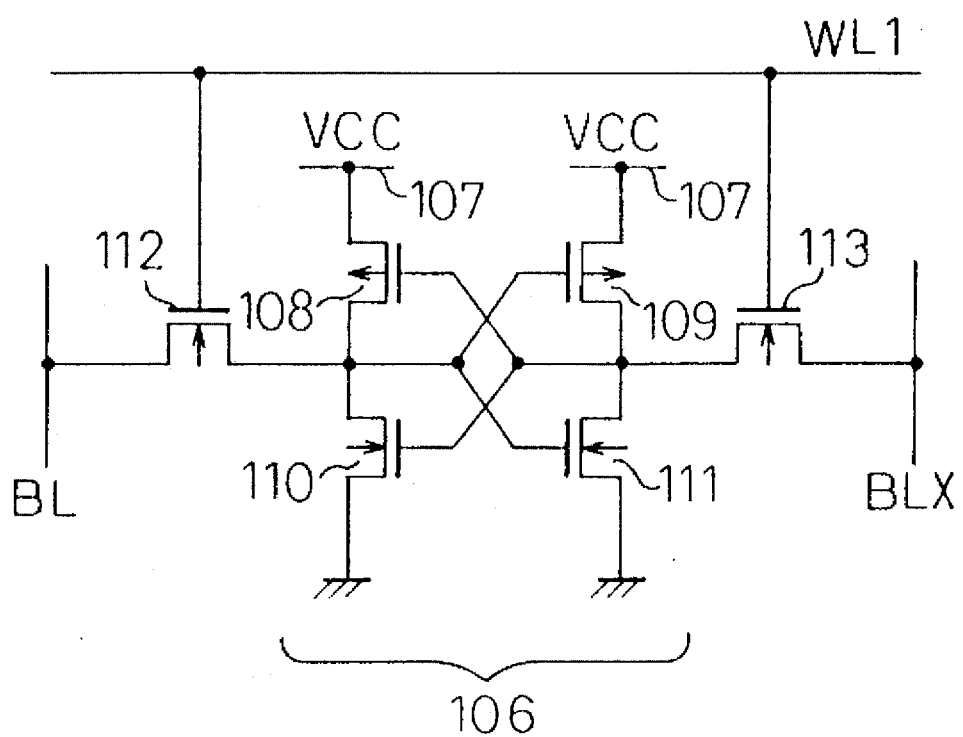
FIG. 11 is a circuit diagram showing a constitution of the memory cell provided in the third embodiment of FIG. 10.

FIG. 11 illustrates a circuit constitution of one of the memory cells formed in the region 105.

In the illustration, reference 106 denotes a flip-flop circuit; reference 107 a VCC power supply line; references 108 and 109 each a pMOS transistor functioning as a load element; references 110 and 111 each an nMOS transistor functioning as a driver element; references 112 and 113 each an nMOS transistor functioning as a transfer gate; and references BL and BLX each a complementary bit line.

The load transistors (pMOS transistors) 108 and 109 are formed in the N-type well 97, and the driver transistors (nMOS transistors) 110 and 111 and the transfer transistors (nMOS transistors) 112 and 113 are formed in the P-type well 101.

In such a CMOS-type memory cell in which load elements are formed by pMOS transistors, when a writing of data is carried out to the memory cell, it takes five or six nanoseconds to charge one of a pair of data retention nodes of the memory cell up to a level of VCC.

Accordingly, when an operation speed with respect to the CMOS-type memory cell becomes high such as an operation cycle of two nanoseconds, a data retention stability of the memory cell in the case where a reading of data is carried out immediately after a writing of data, is determined by the ratio of a current-driving capacity of each driver transistor 110, 111 to a current-driving capacity of each transfer transistor 112, 113.

Referring back to FIG. 10, references 114 to 119 each denote a row decoder; references 120 to 125 each a NAND circuit; references 126 to 131 each an inverter; and references 132 to 134 each a back-bias voltage supplying circuit for supplying the corresponding P-type well 101 to 103 with a back-bias voltage VBB.

Figure 12:
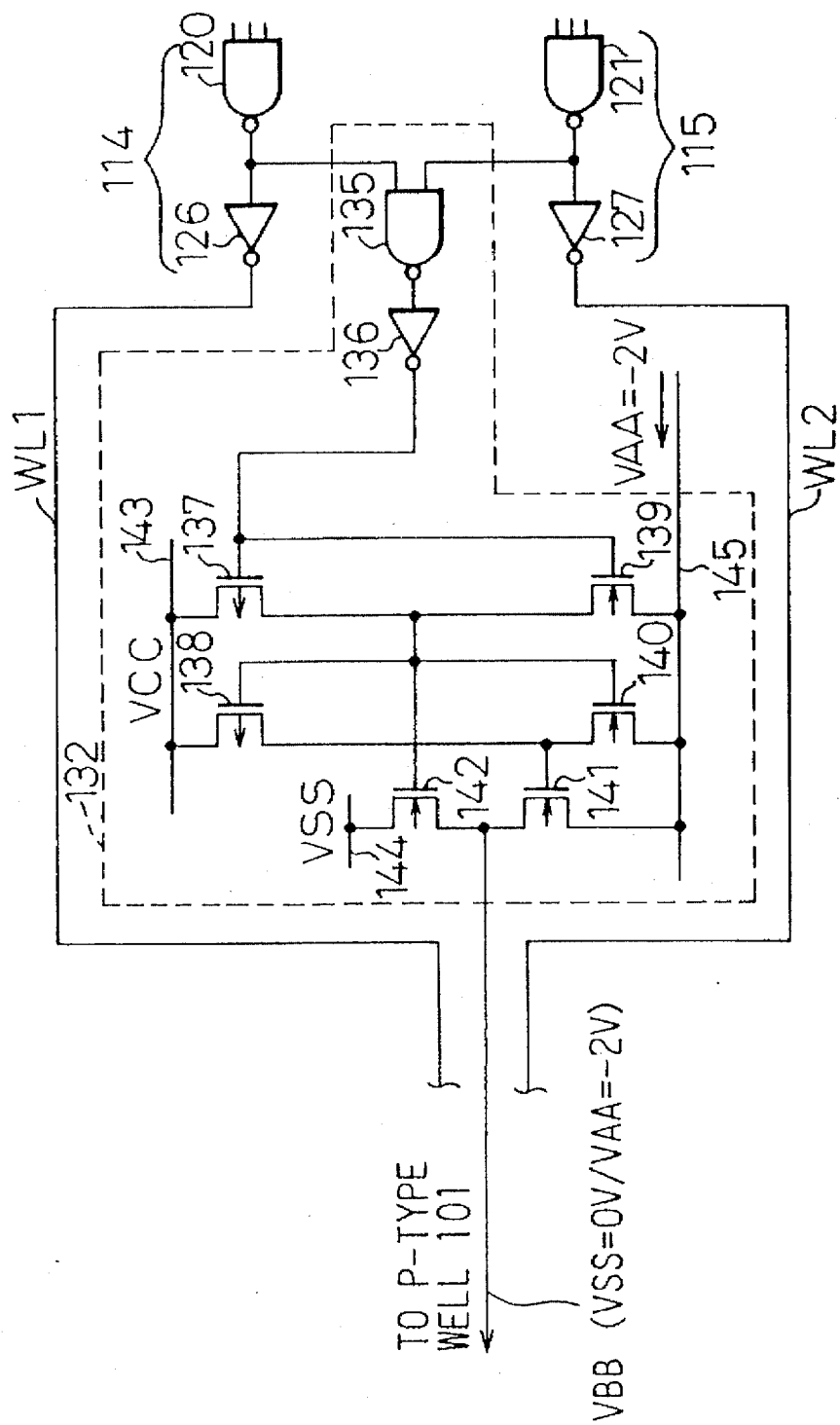
FIG. 12 is a circuit diagram showing a constitution of the back-bias voltage supplying circuit shown in FIG. 10.

The back-bias voltage supplying circuits 132 to 134 have the same circuit constitution as each other, and the back-bias voltage supplying circuit 132 is constituted as shown in FIG. 12.

In FIG. 12, reference 135 denotes a NAND circuit; reference 136 an inverter; references 137 and 138 each a pMOS transistor; references 139 to 142 each an nMOS transistor; reference 143 a VCC power supply line; reference 144 a VSS power supply line; and reference 145 a VAA voltage line for carrying a negative voltage VAA, e.g., −2 V.

Figure 13:
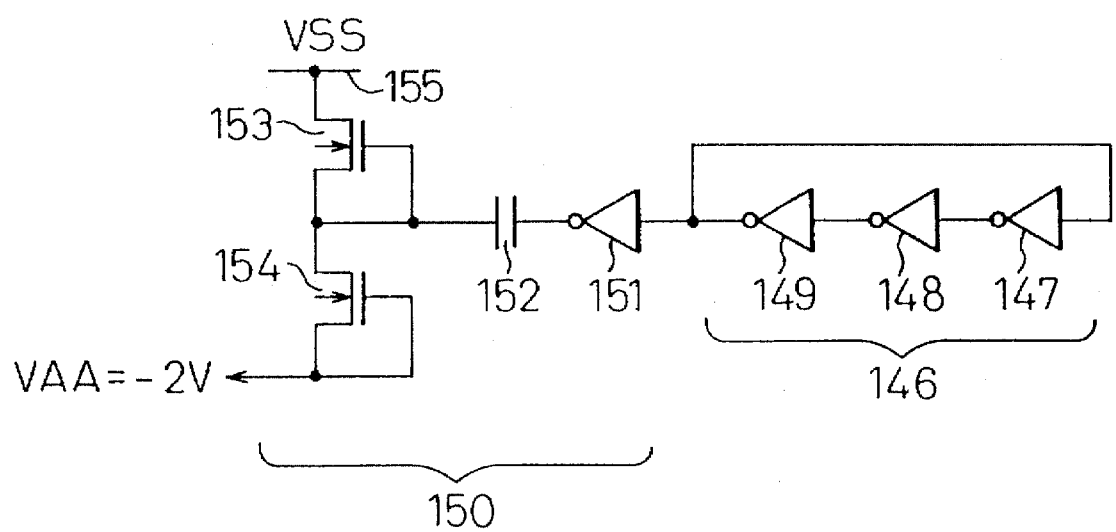
FIG. 13 is a circuit diagram showing a constitution of the negative voltage generating circuit used in the third embodiment of the present invention.

The negative voltage VAA carried by the VAA voltage line 145 is generated by a circuit constituted as shown in FIG. 13. In the negative voltage generating circuit, reference 146 denotes a ring oscillator; references 147 to 149 each an inverter; reference 150 a charge-pumping circuit; reference 151 an inverter functioning as a buffer; reference 152 a capacitor; references 153 and 154 each an nMOS transistor; and reference 155 a power supply line for supplying the ground voltage VSS. Note, the negative voltage generating circuit shown in FIG. 13 is provided commonly for each of the back-bias voltage supplying circuits 132 to 134.

Referring to FIG. 12, when the word line WL1 is selected, an output of the NAND circuit 120 is made "L" level and thus an output of the inverter 126 (i.e., potential on the word line WL1) is made "H" level. On the other hand, an output of the NAND circuit 121 is made "H" level and thus an output of the inverter 127 (i.e., potential on the word line WL2) is made "L" level. Also, since the output of the NAND circuit 120 is at "L" level, an output of the NAND circuit 135 is made "H" level and thus an output of the inverter 136 is made "L" level.

Accordingly, the pMOS transistor 137 is turned ON and the nMOS transistor 139 is turned OFF. As a result, the pMOS transistor 138 is turned OFF and the nMOS transistor 140 is turned ON. Also, the nMOS transistor 142 is turned ON and the nMOS transistor 141 is turned OFF.

Therefore, in this case, the ground voltage VSS (=0 V) as the back-bias voltage VBB is fed from the VSS power supply line 144 via the nMOS transistor 142 to the P-type well 101.

Contrary to this, when both of the word lines WL1 and WL2 are not selected, the respective outputs of the NAND circuits 120 and 121 are made "H" level and thus the outputs of the inverters 126 and 127 (i.e., each potential on the word lines WL1 and WL2) are made "L" level. Also, since the outputs of the NAND circuits 120 and 121 are at "H" level, the output of the NAND circuit 135 is made "L" level and thus the output of the inverter 136 is made "H" level.

Accordingly, the pMOS transistor 137 is turned OFF and the nMOS transistor 139 is turned ON. As a result, the pMOS transistor 138 is turned ON and the nMOS transistor 140 is turned OFF. Also, the nMOS transistor 142 is turned OFF and the nMOS transistor 141 is turned ON.

Therefore, in this case, the negative voltage VAA (=−2 V) as the back-bias voltage VBB is fed from the VAA voltage line 145 via the nMOS transistor 141 to the P-type well 101.

Namely, when a word line is selected from among the word lines WL1 to WL6 shown in FIG. 12, the ground voltage VSS (=0 V) is fed as the back-bias voltage VBB to the corresponding P-type well in which driver transistors constituting each memory cell connected to the selected word line are formed, and the negative voltage VAA (=−2 V) is fed as the back-bias voltage VBB to the other P-type wells.

For example, by selecting the threshold voltage VTH of each driver transistor 110, 111 to be approximately 0.4 V in the case of the back-bias voltage VBB being 0 V, it is possible to heighten the threshold voltage VTH of each driver transistor 110, 111 up to approximately 0.9 V when the back-bias voltage VBB is −2 V.

Thus, in the present embodiment, when the memory device is in its accessed state, it is possible to relatively decrease the threshold voltage VTH of each driver transistor 110, 111 constituting a selected memory cell, e.g., to approximately 0.4 V. As a result, it is possible to realize a stable data retention operation with respect to the selected memory cell.

Also, when the memory device is in its accessed state, in each of non-selected memory cells, it is possible to suppress a leak current in the case of the gate voltage VG of each driver transistor being 0 V, e.g., to approximately 1.2 pA. Namely, it is possible to fully decrease the leak current, compared with 1 μA which is the maximum current value that each load element (pMOS transistor 108,109) can supply. As a result, it is possible to realize a stable data retention operation with respect to the non-selected memory cells.

On the other hand, when the memory device is in its stand-by state, it is possible to relatively increase the threshold voltage VTH of each driver transistor constituting the respective memory cells, e.g., to approximately 0.9 V. As a result, it is possible to suppress a leak current in the case of the gate voltage VG being 0 V, to approximately $1.2 \times 10^{-5}$ pA. For example, where the memory device has the capacity of 1M bits, it is possible to suppress the sum of leak currents to approximately 12 pA.

As explained above, according to the third embodiment of the present invention, it is possible to realize a stable data retention operation under the condition of a lower power supply voltage, and to reduce a dissipated power in a stand-by state.

Figure 14:
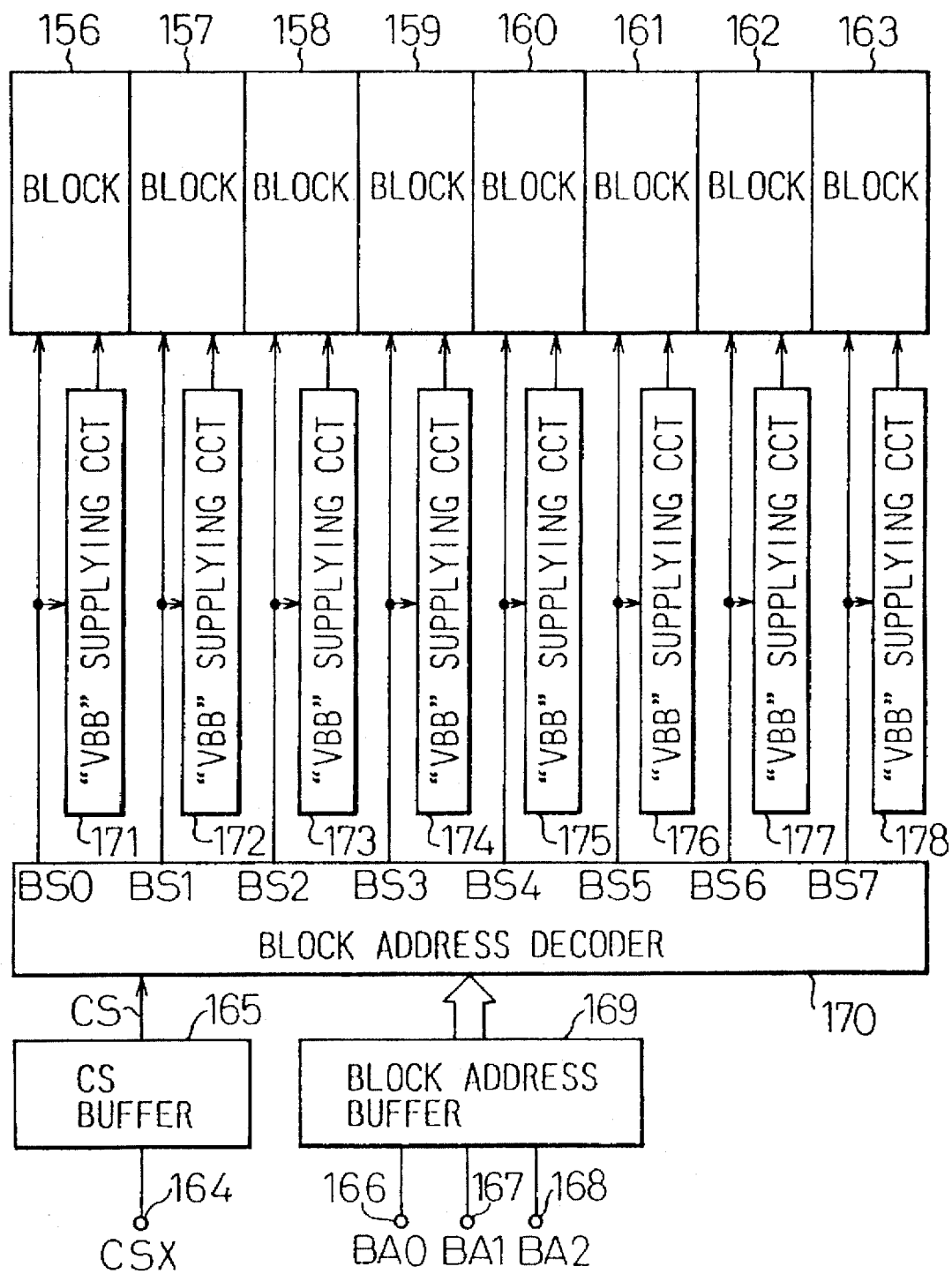
FIG. 14 is a block diagram showing a constitution of the main part in a fourth embodiment of the SRAM device according to the first aspect of the present invention.

FIG. 14 illustrates a constitution of the main part in the fourth embodiment of the present invention.

In the illustration, references 156 to 163 each denote a memory cell region referred to as a "block". The blocks 156 to 163 have the same row addresses and the same column addresses as each other, and are selected based on block address signals BA0, BA1 and BA2. Each block 156 to 163 includes a predetermined number of memory cells, each as shown in FIG. 3, arranged in matrix therein. The blocks 156 to 163 have the capacity of 128K bits, respectively, and thus the entire memory device has the capacity of 1M bits.

Also, reference 164 denotes an input terminal for receiving an active-low chip select signal CSX from the outside of the device, and reference 165 denotes a CS buffer responsive to the chip select signal CSX, for outputting an inverted internal chip select signal CS. Also, references 166 to 168 denote input terminals for receiving the block address signals BA0 to BA2, respectively, and reference 169 denotes a block address buffer responsive to the received block address signals BA0 to BA2. Also, reference 170 denotes a block address decoder for decoding the block address signals BA0 to BA2 to output block selection signals BS0 to BS7.

Also, references 171 to 178 denote back-bias voltage supplying circuits provided for the blocks 156 to 163, respectively. Each of the back-bias voltage supplying circuits 171 to 178 feeds a back-bias voltage VBB to a corresponding P-type well in which driver transistors constituting each memory cell arranged in a corresponding block are formed.

Figure 15:
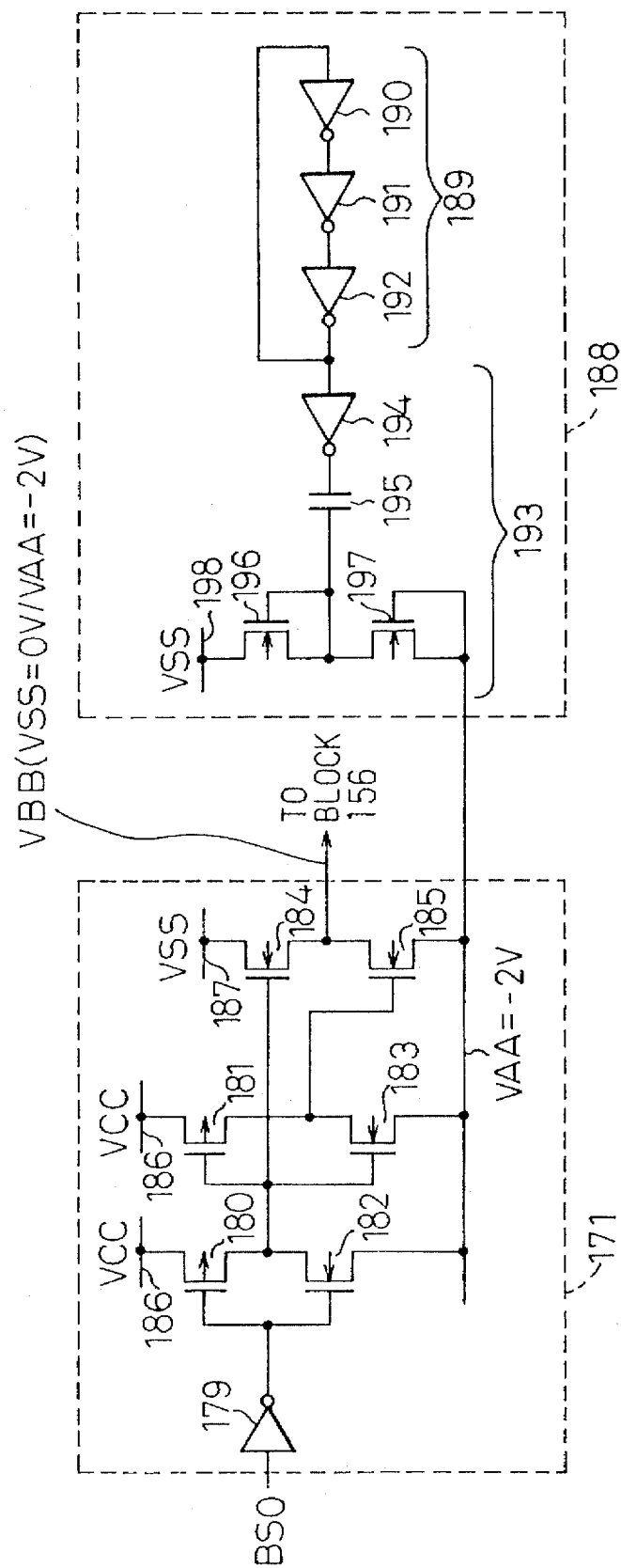
FIG. 15 is a circuit diagram showing a constitution of the back-bias voltage supplying circuit and the negative voltage generating circuit used in the fourth embodiment of FIG. 14.

The back-bias voltage supplying circuits 171 to 178 have the same circuit constitution as each other, and the back-bias voltage supplying circuit 171 is constituted as shown in FIG. 15.

In FIG. 15, reference 179 denotes an inverter; references 180 and 181 each a pMOS transistor; references 182 to 185 each an nMOS transistor; reference 186 a VCC power supply line; reference 187 a VSS power supply line; and reference 188 a negative voltage generating circuit for generating a negative voltage VAA, e.g., −2 V. In the negative voltage generating circuit 188, reference 189 denotes a ring oscillator; references 190 to 192 each an inverter; reference 193 a charge-pumping circuit; reference 194 an inverter functioning as a buffer; reference 195 a capacitor; references 196 and 197 each an nMOS transistor; and reference 198 a VSS power supply line.

In the back-bias voltage supplying circuit 171 shown in FIG. 15, when the block selection signal BS0 is made "H" level and thus the corresponding block 156 is selected, an output of the inverter 179 is made "L" level. Accordingly, the pMOS transistor 180 is turned ON and the nMOS transistor 182 is turned OFF. As a result, the pMOS transistor 181 is turned OFF and the nMOS transistor 183 is turned ON. Also, the nMOS transistor 184 is turned ON and the nMOS transistor 185 is turned OFF.

Therefore, in this case, the ground voltage VSS (=0 V) as the back-bias voltage VBB is fed from the VSS power supply line 187 via the nMOS transistor 184 to the block 156, i.e., to a corresponding P-type well in which driver transistors constituting each memory cell arranged in the block 156 are formed.

Contrary to this, when the block selection signal BS0 is made "L" level and thus the corresponding block 156 is not selected, the output of the inverter 179 is made "H" level. Accordingly, the pMOS transistor 180 is turned OFF and the nMOS transistor 182 is turned ON. As a result, the pMOS transistor 181 is turned ON and the nMOS transistor 183 is turned OFF. Also, the nMOS transistor 184 is turned OFF and the nMOS transistor 185 is turned on.

Therefore, in this case, the negative voltage VAA (=−2 V) as the back-bias voltage VBB is fed from the negative voltage generating circuit 188 via the nMOS transistor 185 to the block 156, i.e., to the corresponding P-type well in which driver transistors constituting each memory cell arranged in the block 156 are formed.

Namely, when a block is selected from among the blocks 156 to 163 shown in FIG. 14, the ground voltage VSS (=0 V) is fed as the back-bias voltage VBB to the corresponding P-type well in which driver transistors constituting each memory cell included in the selected block are formed, and the negative voltage VAA (=−2 V) is fed as the back-bias voltage VBB to respective P-type wells included in the other non-selected blocks.

For example, by selecting the threshold voltage of each driver transistor to be approximately 0.4 V in the case of the back-bias voltage VBB being 0 V, it is possible to heighten the threshold voltage of each driver transistor up to approximately 0.9 V when the back-bias voltage VBB is −2 V.

Thus, in the present embodiment, it is possible to relatively decrease the threshold voltage of respective driver transistors constituting each memory cell included in a selected block, e.g., to approximately 0.4 V. As a result, it is possible to realize a stable data retention operation with respect to the selected block.

Also, in each memory cell included in non-selected blocks, it is possible to suppress a leak current in the case of the gate voltage of each driver transistor being 0 V, e.g., to approximately 1.2 pA. Namely, it is possible to fully decrease the leak current, compared with 1 nA which is the maximum current value that each load resistor can supply. As a result, it is possible to realize a stable data retention operation with respect to the non-selected blocks.

Accordingly, when the memory device is in its accessed state, the leak current per one memory cell in one selected block amounts to 1.2 pA. since the threshold voltage is 0.4 V. Namely, the sum of leak currents in the entire selected block amounts to approximately 150 nA.

Also, in each of seven non-selected blocks, the leak current per one memory cell amounts to $1.2 \times 10^{-5}$ pA since the threshold voltage is 0.9 V. Namely, the sum of leak currents in the entire non-selected blocks amounts to approximately 10.5 pA.

Thus, when the memory device is in its accessed state, the sum of leak currents in the entire memory device amounts to approximately 150 nA, and thus is reduced to approximately one eighth the current (1.2 µA) in a conventional SRAM device.

On the other hand, when the memory device is in its stand-by state, it is possible to relatively increase the threshold voltage of each driver transistor constituting the respective memory cells included in the blocks 156 to 163, e.g., to approximately 0.9 V. As a result, it is possible to suppress a leak current in the case of the gate voltage VG being 0 V, to approximately $1.2 \times 10^{-5}$ pA. Since the memory device has the capacity of 1M bits, it is possible to suppress the sum of leak currents to approximately 12 pA.

As explained above, according to the fourth embodiment of the present invention, it is possible to realize a stable data retention operation under the condition of a lower power supply voltage, and to reduce a dissipated power in a stand-by state.

Figure 16:
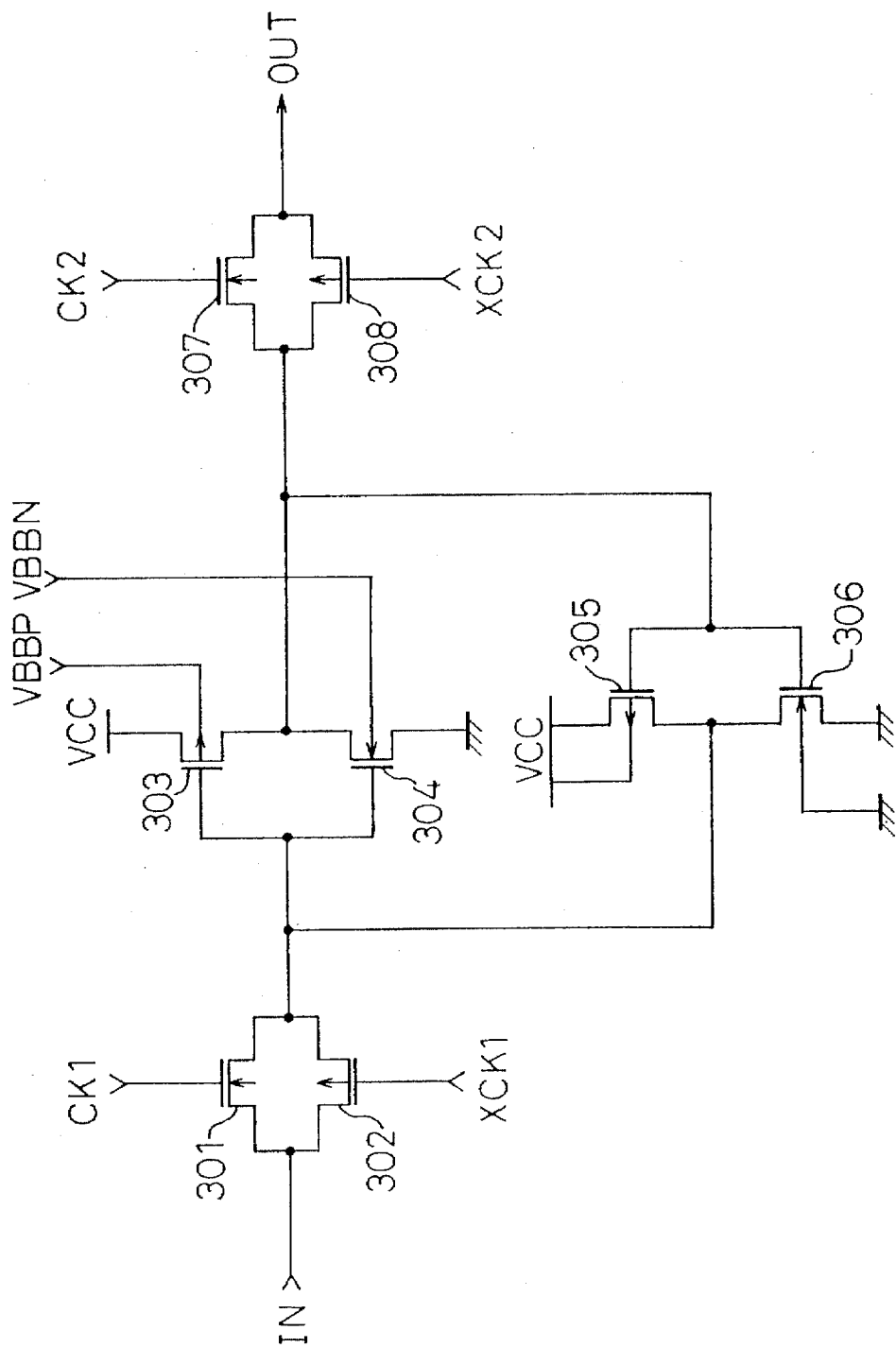
FIG. 16 is a circuit diagram showing a constitution of a first embodiment of the data retention circuit according to the second aspect of the present invention.

FIG. 16 illustrates a circuit constitution of a first embodiment of the data retention circuit according to the second aspect of the present invention.

The illustrated circuit shows a CMOS latch circuit. In the illustration, references 301, 304, 306 and 307 each denote an nMOS transistor, and references 302, 303, 305 and 308 each denote a pMOS transistor.

The pMOS transistor 303 and the nMOS transistor 304 constitute a master inverter, and the pMOS transistor 305 and the nMOS transistor 306 constitute a slave inverter. The master inverter 303, 304 and the slave inverter 305, 306 constitute a flip-flop circuit functioning as a latch part of the CMOS latch circuit. Back-bias voltages VBBP and VBBN are supplied to back gates of the pMOS transistor 303 and the nMOS transistor 304, respectively. Also, voltages of the VCC level and the ground level (0 V) are applied to back gates of the pMOS transistor 305 and the nMOS transistor 306, respectively. Although not shown, the back gate of each nMOS transistor corresponds to a P-type well in which the transistor is formed, and the back gate of each pMOS transistor corresponds to an N-type well in which the transistor is formed.

Also, the nMOS transistor 301 and the pMOS transistor 302 constitute a transmission gate, and are turned ON or OFF in response to a clock signal CK1 and its inverted clock signal XCK1, respectively. In the same manner, the nMOS transistor 307 and the pMOS transistor 308 constitute a transmission gate, and are turned ON or OFF in response to a clock signal CK2 and its inverted clock signal XCK2, respectively.

Also, with respect to the transistors 303 and 304 constituting the master inverter, each threshold voltage VTH is selected to be a lower voltage. For example, when the back-bias voltage VBB (VBBP or VBBN) is 0 V, the threshold voltage VTH is selected to be 0 V. With respect to the other pMOS transistors, when the back-bias voltage VBB is 0 V, the threshold voltage VTH is selected to be −0.4 V. Also, with respect to the other nMOS transistors, when the back-bias voltage VBB is 0 V, the threshold voltage VTH is selected to be +0.4 V.

According to the constitution shown in FIG. 16, by suitably controlling application timings of the clock signals CK1, XCK1, CK2 and XCK2, an input data IN is input via the transmission gate 301, 302 and latched in the latch part 303 to 306, and also is output via the transmission gate 307,308 as an output data OUT.

Figure 17:
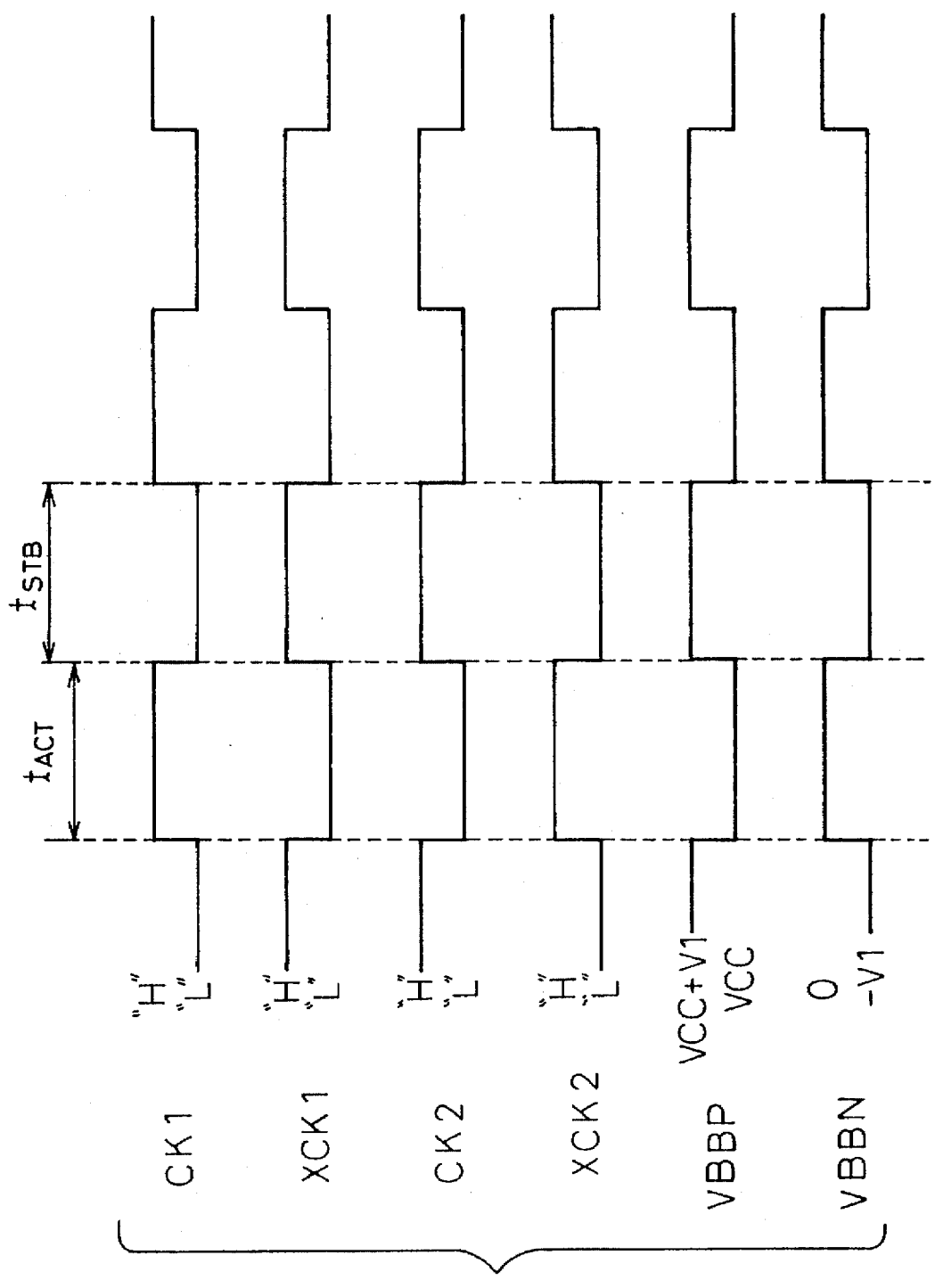
FIG. 17 is an operational timing chart of the circuit shown in FIG. 16.

FIG. 17 shows an example of the operational timing of the circuit of FIG. 16. In the timing chart, reference $t_{ACT}$ indicates an active period in which the CMOS latch circuit latches the input data IN in the latch part 303 to 306, and reference $t_{STB}$ indicates a stand-by period in which the CMOS latch circuit outputs the latched data as the output data OUT.

In the active period, the current-driving capacity of the master inverter 303, 304 is set to be approximately twice that of the slave inverter 305, 306. To this end, the back-bias voltage VBBP of the pMOS transistor 303 is selected to be a level of VCC, and the back-bias voltage VBBN of the nMOS transistor 304 is selected to be the ground level (0 V). Thus, by the difference between the current-driving capacities, it is possible to speedily carry out the latch operation of the input data IN.

On the other hand, in the stand-by period, the back-bias voltage VBBP of the pMOS transistor 303 is selected to be a level of VCC+V1, and the back-bias voltage VBBN of the nMOS transistor 304 is selected to be −V1. As a result, it is possible to prevent a pass-through current from flowing in the master inverter 303, 304, and thus to save a power dissipated therein. Note, the voltage value of V1 is set to be approximately 0.5 V.

Although, in the embodiment shown in FIG. 16, the inputting, retention, and outputting of data are controlled using the clock signals suitably produced within the circuit, this is not restrictive. For example, a suitable control signal fed from the outside of the circuit may be used.

Figure 18:
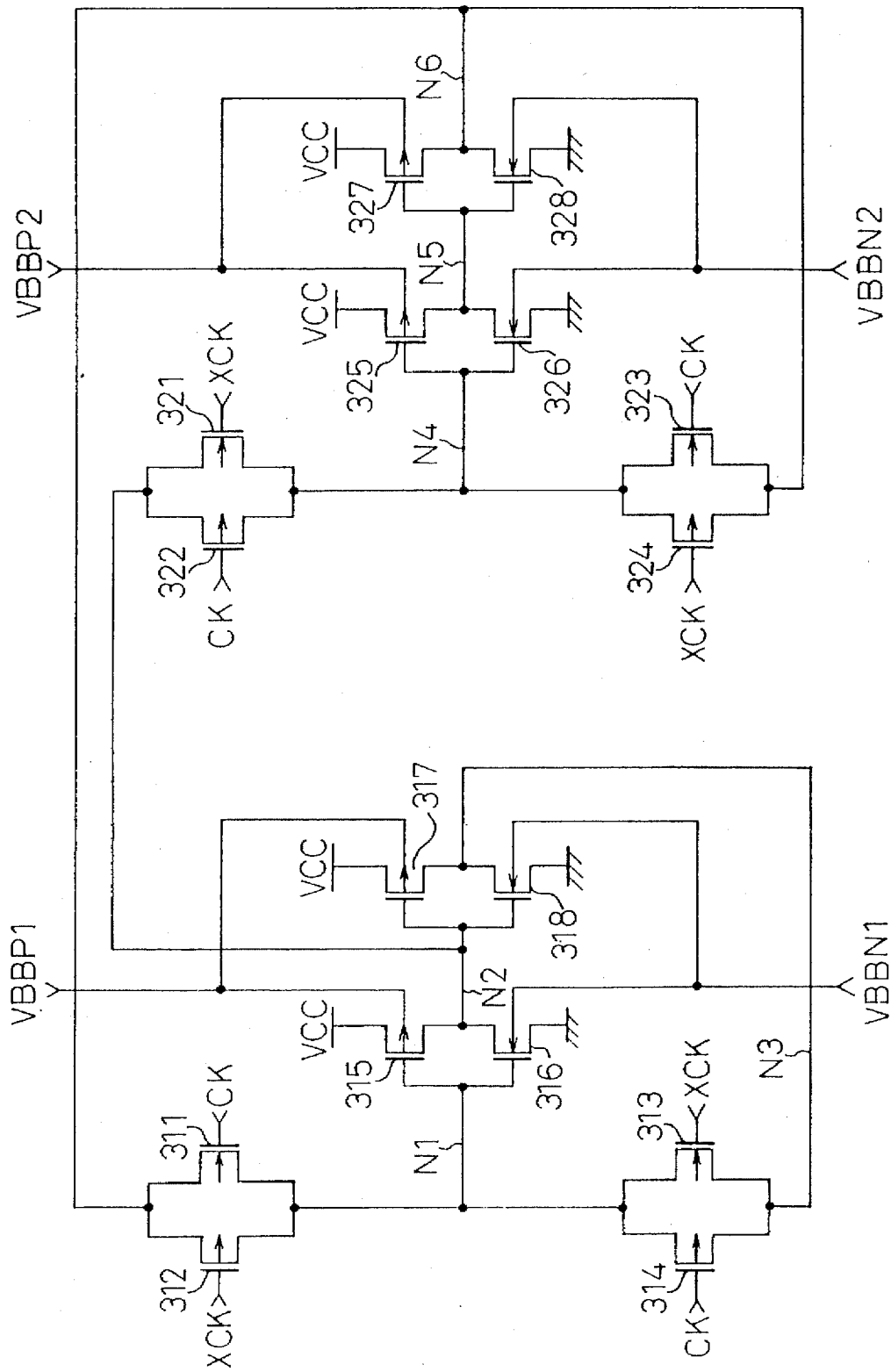
FIG. 18 is a circuit diagram showing a constitution of a second embodiment of the data retention circuit according to the second aspect of the present invention.

FIG. 18 illustrates a circuit constitution of a second embodiment of the data retention circuit according to the second aspect of the present invention.

The illustrated circuit shows a CMOS toggle flip-flop circuit. In the illustration, references 311, 313, 316, 318, 321, 323, 326 and 328 each denote an nMOS transistor, and references 312, 314, 315, 317, 322, 324, 325 and 327 each denote a pMOS transistor.

The transistors 315 and 316, the transistors 317 and 318, the transistors 325 and 326, and the transistors 327 and 328, constitute a CMOS inverter, respectively. Two CMOS inverters 315 to 318 shown in the left side constitute a master flip-flop circuit, and two CMOS inverters 325 to 328 shown in the right side constitute a slave flip-flop circuit. Back-bias voltages VBBP1 and VBBN1 are supplied to back gates of the pMOS transistors 315, 317 and the nMOS transistors 316, 318, respectively. Also, back-bias voltages VBBP2 and VBBN2 are supplied to back gates of the pMOS transistors 325, 327 and the nMOS transistors 326, 328, respectively.

Also, the transistors 311 and 312, the transistors 313 and 314, the transistors 321 and 322, and the transistors 323 and 324, constitute a transmission gate, respectively. The transistors 311, 314, 322 and 323 are turned ON or OFF in response to a clock signal CK, and the transistors 312, 313, 321 and 324 are turned ON or OFF in response to an inverted clock signal XCK.

In the circuit constitution shown in FIG. 18, by suitably controlling application timings of the clock signals CK and XCK, it is possible to retain data in the master flip-flop circuit 315 to 318 or in the slave flip-flop circuit 325 to 328, or to transfer the retained data between the master flip-flop circuit and the slave flip-flop circuit.

Figure 19:
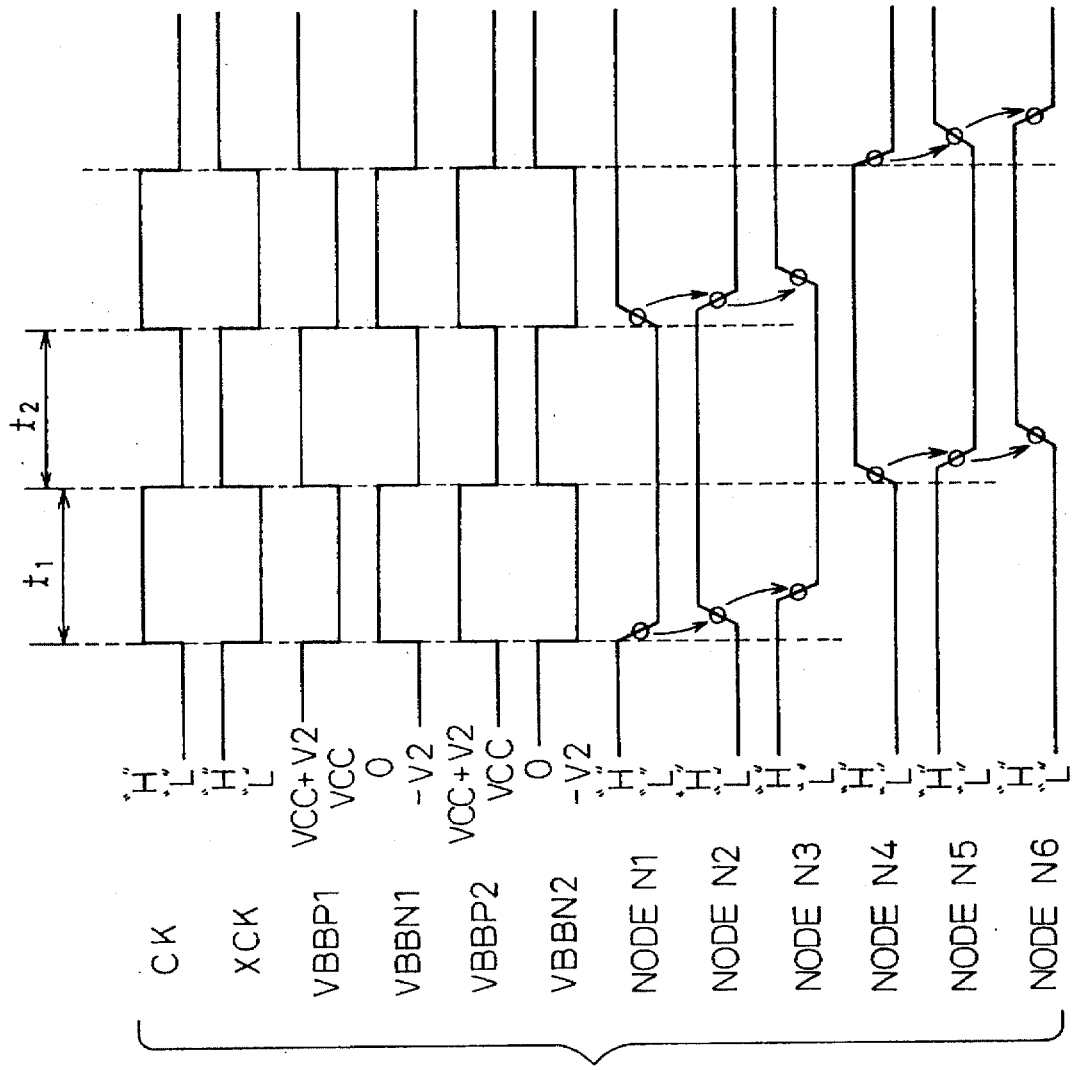
FIG. 19 is an operational timing chart of the circuit shown in FIG. 18.

FIG. 19 shows an example of the operational timing of the circuit of FIG. 18.

First, when the clock signal CK is at "H" level (in a period indicated by reference $t_1$ in FIG. 19), the master flip-flop circuit is operative (i.e., active state) and the slave flip-flop circuit is inoperative (i.e., stand-by state).

In this period ($t_1$), the back-bias voltage VBBP1 of each pMOS transistor 315, 317 is selected to be a level of VCC, and the back-bias voltage VBBN1 of each nMOS transistor 316, 318 is selected to be the ground level (0 V). As a result, it is possible to realize a high speed operation of the master flip-flop circuit.

On the other hand, to save a power dissipated in the slave flip-flop circuit which is in its stand-by state, the back-bias voltage VBBP2 of each pMOS transistor 325, 327 is selected to be a level of VCC+V2, and the back-bias voltage VBBN2 of each nMOS transistor 326, 328 is selected to be −V2. Note, the voltage value of V2 is set to be approximately 0.5 V.

Next, when the clock signal CK is at "L" level (in a period indicated by reference $t_2$ in FIG. 19), the slave flip-flop circuit is operative (i.e., active state) and the master flip-flop circuit is inoperative (i.e., stand-by state).

In this period ($t_2$), to save a power dissipated in the master flip-flop circuit which is in its stand-by state, the back-bias voltage VBBP1 is selected to be a level of VCC+V2, and the back-bias voltage VBBN1 is selected to be −V2. On the other hand, to heighten the operation speed of the slave flip-flop circuit which is in its active state, the back-bias voltage VBBP2 is selected to be a level of VCC, and the back-bias voltage VBBN2 is selected to be the ground level (0 V).

Although the present invention has been disclosed and described by way of six embodiments, it is apparent to those skilled in the art that other embodiments and modifications of the present invention are possible without departing from the essential features thereof.

What is claimed is:

1. A data retention circuit comprising:

a data latch part including at least one flip-flop circuit having transistors of CMOS structure;

a gating means responsive to a control signal, for controlling an inputting of data into said data latch part and an outputting of data from said data latch part; and means for controlling a back-bias voltage of at least one of the transistors constituting said flip-flop circuit to be a first voltage in an active state of said data retention circuit, and for controlling said back-bias voltage to be a second voltage different from said first voltage in a stand-by state of said data retention circuit, wherein said data latch part comprises one flip-flop circuit including a first CMOS inverter and a second CMOS inverter, and wherein when said data retention circuit is in the active state, respective back-bias voltages of transistors constituting said first CMOS inverter are controlled to be the same as respective back-bias voltages of transistors constituting said second CMOS inverter, and when said data retention circuit is in the stand-by state, respective back-bias voltages of transistors constituting said first CMOS inverter are controlled to be different from respective back-bias voltages of transistors constituting said second CMOS inverter.

2. The data retention circuit as set forth in claim 1, wherein said gating means comprises at least one transmission gate having a pair of transistors of CMOS structure, the pair of transistors responsive to a pair of complementary clock signals, respectively.

3. A data retention circuit comprising:

a data latch part including at least one flip-flop circuit having transistors of CMOS structure;

a gating means responsive to a control signal, for controlling an inputting of data into said data latch part and an outputting of data from said data latch part; and means for controlling a back-bias voltage of at least one of the transistors constituting said flip-flop circuit to be a first voltage in an active state of said data retention circuit, and for controlling said back-bias voltage to be a second voltage different from said first voltage in a stand-by state of said data retention circuit, wherein said data latch part comprises a master flip-flop circuit including two series-connected CMOS inverters, and a slave flip-flop circuit including two series-connected CMOS inverters, and wherein said master flip-flop circuit and said slave flip-flop circuit are brought to the active state or the stand-by state alternately to each other, according to the control signal applied to said gating means.

4. The data retention circuit as set forth in claim 3, wherein said gating means comprises a transmission gate connected between input/output nodes of said master flip-flop circuit and having a pair of transistors of CMOS structure responsive to a pair of complementary clock signals, respectively; a transmission gate connected between input/output nodes of said slave flip-flop circuit and having a pair of transistors of CMOS structure responsive to said pair of clock signals, respectively; and two transmission gates connected between said master flip-flop circuit and said slave flip-flop circuit, respectively, each gate having a pair of transistors of CMOS structure responsive to said pair of clock signals, respectively.

\* \* \* \* \*